United States Patent
Yu et al.

(10) Patent No.: US 9,029,876 B2
(45) Date of Patent: May 12, 2015

(54) DISPLAY PANEL WITH SHIELD LAYER PARTIALLY OVER GATE LINE

(75) Inventors: Chia Hua Yu, New Taipei (TW); I Fang Wang, Changhua (TW); Feng Weei Kuo, Pingtung County (TW); Jui Chi Lai, Kaohsiung (TW); Ko Ruey Jen, Taipei (TW); Guang Shiung Chao, Kaohsiung (TW)

(73) Assignee: Hannstar Display Corp., New Taipei (TW)

( * ) Notice: Subject to any disclaimer, the term of this patent is extended or adjusted under 35 U.S.C. 154(b) by 457 days.

(21) Appl. No.: 13/329,623

(22) Filed: Dec. 19, 2011

(65) Prior Publication Data

US 2012/0235174 A1 Sep. 20, 2012

(30) Foreign Application Priority Data

Mar. 16, 2011 (TW) .............................. 100108882 A

(51) Int. Cl.
*H01L 33/00* (2010.01)
*G02F 1/1343* (2006.01)
*H01L 27/12* (2006.01)
*G02F 1/1362* (2006.01)

(52) U.S. Cl.
CPC ......... *G02F 1/134363* (2013.01); *H01L 27/124* (2013.01); *G02F 2001/136218* (2013.01)

(58) Field of Classification Search
USPC ............... 257/76–89, 103, E33.053; 349/141
See application file for complete search history.

(56) References Cited

U.S. PATENT DOCUMENTS

| | | | |
|---|---|---|---|
| 6,950,166 B2 * | 9/2005 | Kadotani | 349/141 |
| 7,304,703 B1 * | 12/2007 | Takeda et al. | 349/129 |
| 7,576,824 B2 * | 8/2009 | Kim | 349/141 |
| 7,760,305 B2 * | 7/2010 | Takeda et al. | 349/129 |
| 7,787,091 B2 * | 8/2010 | Horiguchi et al. | 349/141 |
| 7,888,690 B2 * | 2/2011 | Iwafuchi et al. | 257/89 |
| RE43,123 E * | 1/2012 | Sasabayashi et al. | 349/117 |
| 2003/0201450 A1 * | 10/2003 | Yamazaki et al. | 257/88 |
| 2004/0125303 A1 * | 7/2004 | Chung | 349/141 |
| 2004/0179161 A1 * | 9/2004 | Kim et al. | 349/141 |
| 2004/0183977 A1 * | 9/2004 | Kitagawa et al. | 349/141 |
| 2005/0078256 A1 * | 4/2005 | Hong | 349/141 |
| 2005/0099567 A1 * | 5/2005 | Shimizu et al. | 349/141 |

(Continued)

FOREIGN PATENT DOCUMENTS

| | | |
|---|---|---|
| TW | 200406615 A | 5/2004 |
| TW | 200813579 A | 3/2008 |

*Primary Examiner* — Mohammad Islam
*Assistant Examiner* — Ankush Singal
(74) *Attorney, Agent, or Firm* — Lowe Hauptman & Ham, LLP

(57) ABSTRACT

There is provided a pixel structure of a liquid crystal panel including a transparent substrate, and a gate line, a data line, a switching transistor, a first electrode, a second electrode and a shield layer formed on the transparent substrate. The gate line is substantially perpendicular to the data line. The switching transistor is located adjacent to a crossing point of the gate line and the data line, and is configured to input a display voltage of the data line to the second electrode according to the control of the gate line. The first electrode and the second electrode are arranged in such a way that the display voltage forms a transverse electric field between the first electrode and the second electrode. The shield layer overlaps at least a part of the gate and is electrically isolated from the first electrode and the second electrode.

8 Claims, 4 Drawing Sheets

(56) References Cited

U.S. PATENT DOCUMENTS

| | | | |
|---|---|---|---|
| 2006/0158576 A1* | 7/2006 | Kim et al. | 349/38 |
| 2008/0024689 A1* | 1/2008 | Ahn | 349/43 |
| 2008/0297675 A1* | 12/2008 | Kim | 349/38 |
| 2009/0096950 A1* | 4/2009 | Kim et al. | 349/43 |
| 2009/0237578 A1* | 9/2009 | Naka et al. | 349/33 |
| 2010/0213969 A1* | 8/2010 | Kim | 324/770 |
| 2012/0187411 A1* | 7/2012 | Hayakawa et al. | 257/72 |
| 2013/0120673 A1* | 5/2013 | Yasukawa | 349/5 |

* cited by examiner

US 9,029,876 B2

DISPLAY PANEL WITH SHIELD LAYER PARTIALLY OVER GATE LINE

CROSS REFERENCE TO RELATED APPLICATION

This application claims the priority benefit of Taiwan Patent Application Serial Number 100108882, filed on Mar. 16, 2011, the full disclosure of which is incorporated herein by reference.

BACKGROUND

1. Field of the Invention

This invention generally relates to a liquid crystal display device and, more particularly, to a horizontal electric field type liquid crystal display and pixel structure thereof.

2. Description of the Related Art

Liquid crystal display technologies can be divided into two categories: twisted nematic liquid crystal displays (TN-LCD) and horizontal electric field type liquid crystal displays, wherein the horizontal electric field type liquid crystal displays further include in-plan switching (IPS) mode liquid crystal displays and fringe field switching (FFS) mode liquid crystal displays. In TN-LCD, liquid crystal molecules rotate following the variation of a longitudinal electric field between two opposite glass substrates. In horizontal electric field type liquid crystal display, the common electrode and the pixel electrode are both formed on the thin film transistor array substrate to provide a transverse electric field such that liquid crystal molecules can rotate transversely following the variation of the transverse electric field. Compared with the TN-LCD, the horizontal electric field type liquid crystal display has a wider viewing angle so that the viewing angle problem of the liquid crystal display can be solved.

However, in horizontal electric field type liquid crystal display electric charges can gradually accumulate in the stray capacitance between gate lines and other components of the display with the pixel operation to generate stray electric field which can influence the distribution of the transverse electric field during the pixel operation such that the orientation of liquid crystal molecules close to the gate lines can deviate from the desired direction to cause light leakage in dark state. For example, FIG. 1A shows a pixel structure 9 of a conventional FFS mode liquid crystal display, and as mentioned above electric charges can accumulate in the stray capacitance between the gate line 91 and other components of the display when scan signals are transmitting in the gate line 91. The voltage variation of the stray capacitance can lead to the change of the stray electric field to influence the rotation of liquid crystal molecules close to the gate line 91 to cause the light leakage problem thereby decreasing the contrast of the display. FIG. 1B shows a pixel structure 9' of a conventional IPS mode liquid crystal display in which a plurality of stripe pixel electrodes 92' and common electrodes 93 are alternatively formed on a substrate. When a potential difference is formed between the pixel electrodes 92' and the common electrodes 93, a transverse electric field can then be formed therebetween. Similarly, electric charges can accumulate in the stray capacitance between the gate line 91 and other components of the display due to the transmission of electric signals in the gate line 91 to influence the rotation of liquid crystal molecules close to the gate line 91.

Accordingly, it is necessary to provide a liquid crystal display device and pixel structure thereof that is able to solve or significantly improve the light leakage problem in the horizontal electric field type liquid crystal display so as to improve the contrast of the display.

SUMMARY

The present disclosure provides a liquid crystal panel and pixel structure thereof that is able to solve the light leakage problem in the horizontal electric field type liquid crystal display.

The present disclosure further provides a liquid crystal panel and pixel structure thereof that is able to improve the contrast of the horizontal electric field type liquid crystal display.

The present disclosure provides a pixel structure of a liquid crystal panel including a transparent substrate, and a gate line, a data line, a switching transistor, a first electrode, a second electrode and a shield layer formed on the transparent layer. The gate line is perpendicular to the date line. The switching transistor is located adjacent to a crossing point of the gate line and the date line and configured to input a display voltage of the date line to the second electrode according to the control of the gate line. The first electrode and the second electrode are arranged in such a way that the display voltage forms a transverse electric field between the first electrode and the second electrode. The shield layer overlaps at least a part of the gate line and is electrically isolated from the first electrode and the second electrode.

The present disclosure further provides a liquid crystal panel including a transparent substrate, a plurality of gate lines, a plurality of common lines, a plurality of date lines, a plurality of first electrodes, a plurality of second electrodes, a plurality of switching transistors and a plurality of shield layers. The gate lines and the common lines are formed on the transparent substrate in parallel. The date lines are formed on the transparent substrate in parallel and perpendicular to the gate lines and the common lines. The first electrodes are respectively formed in a pixel area defined by two of the gate lines and two of the data lines and electrically coupled to the common lines. The second electrodes are respectively formed in the pixel areas. The switching transistors are respectively located adjacent to crossing points of the gate lines and the date lines and configured to input display voltages of the data lines to the second electrodes according to the control of the gate lines, wherein each of the first electrodes and the associated second electrode are arranged in such a way that the associated display voltage forms a transverse electric field between the first electrode and the second electrode. The shield layers respectively overlap at least a part of the gate lines, and are electrically isolated from the first electrodes and the second electrodes.

In an aspect, a width of the shield layer is larger than that of the gate line; the shield layer does not overlap with the switching transistor; and a material of the shield layer is identical to that of the second electrode.

In an aspect, the first electrode is coupled to a first voltage and the shield layer is coupled to a second voltage, and the first voltage and the second voltage are independent from each other. For example, the first voltage and the second voltage may be individually provided by the display panel so as to prevent the coupling effect from causing the voltage fluctuation of the first electrode.

The display panel of the present disclosure may be an in-plane switching mode liquid crystal panel or a fringe field switching mode liquid crystal panel. In the present disclosure, by disposing a shield layer upon and overlapping a gate line, the stray electric field, which can influence the orientation of liquid crystals nearby, due to the voltage fluctuation of the stray capacitance associated with the gate line will not be generated when scan signals are transmitting in the gate line.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE EMBODIMENT

Figure 1A:
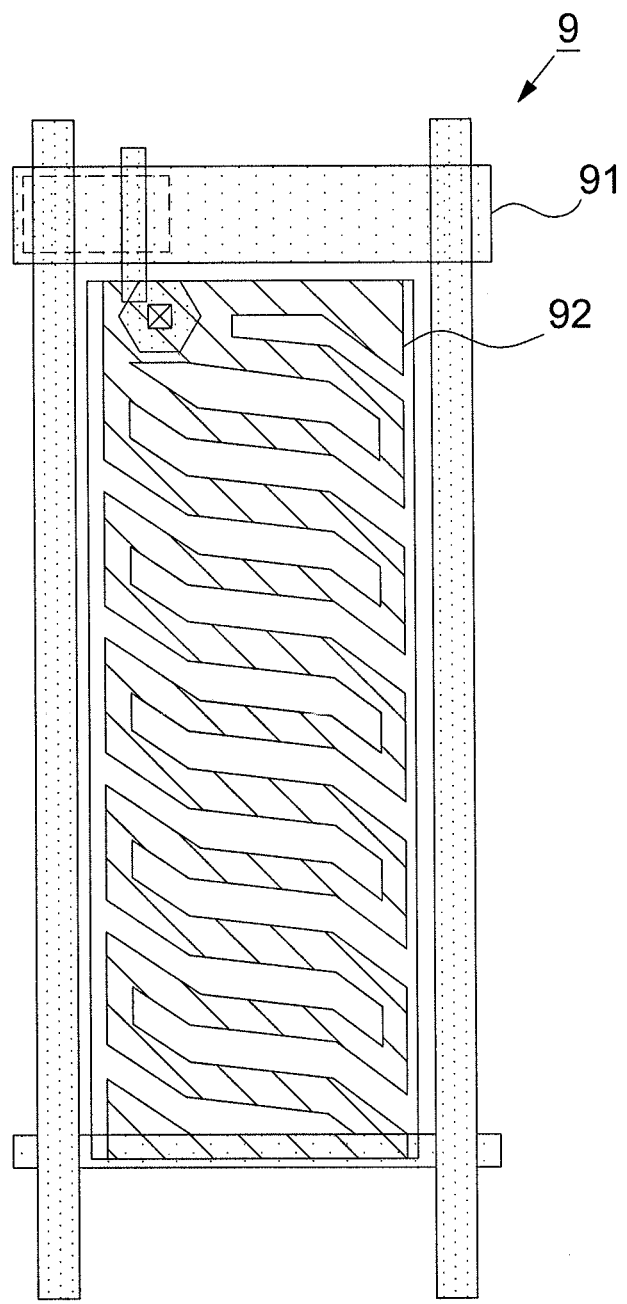
FIG. 1A shows a schematic plan view of the pixel structure of a conventional FFS mode liquid crystal display.
Figure 1B:
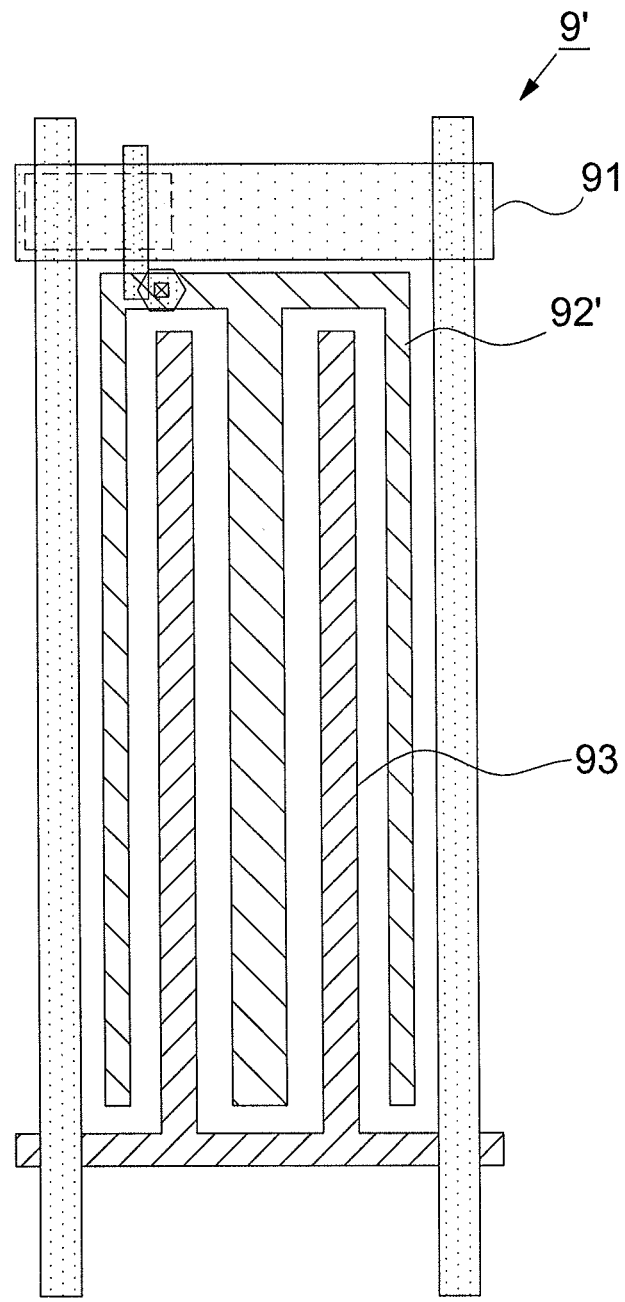
FIG. 1B shows a schematic plan view of the pixel structure of a conventional IPS mode liquid crystal display.

It should be noted that, wherever possible, the same reference numbers will be used throughout the drawings to refer to the same or like parts.

In the drawings of the present disclosure, only a part of the components are shown and other components that are not directly related to the present disclosure are omitted.

The liquid crystal panel and pixel structure thereof of the present disclosure will be illustrated by means of a fringe field switching (FFS) mode liquid crystal panel.

Figure 2:
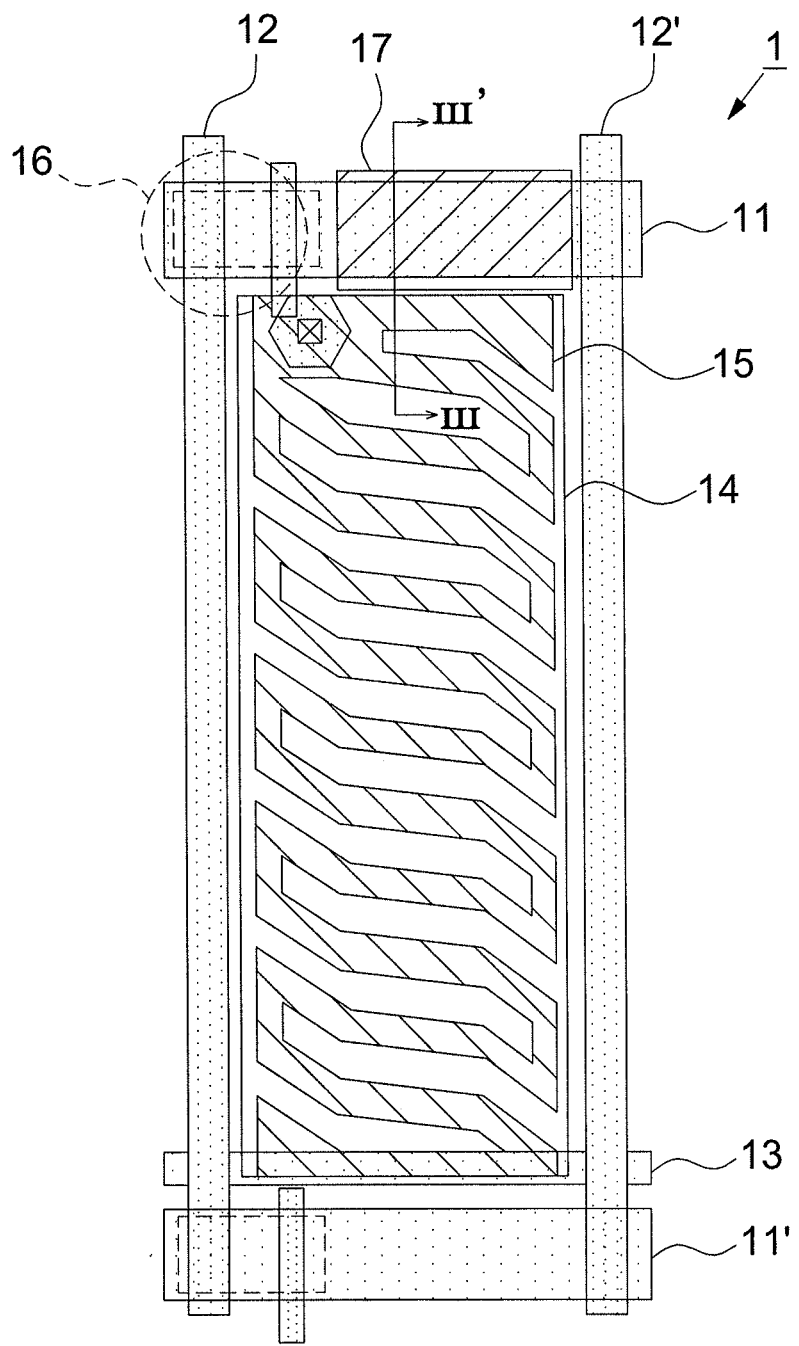
FIG. 2 shows a schematic plan view of the pixel structure of the liquid crystal panel according to an embodiment of the present disclosure.

Please refer to FIG. 2, it shows a schematic plan view of a pixel structure of the FFS mode liquid crystal panel according to an embodiment of the present disclosure. Since the color filter substrate is well known to the art, the pixel structure shown in FIG. 2 only includes the pixel structure of the array substrate not including that of the color filter substrate.

The pixel structure 1 includes a transparent substrate, and two scan lines 11 and 11', two data lines 12 and 12', a common line 13, a first electrode 14, a second electrode 15, a switching transistor 16 and a shield layer 17 formed on the transparent substrate, wherein the parallel scan lines 11 and 11' are substantially perpendicular to the parallel data lines 12 and 12' to define a pixel area of the pixel structure 1. The scan lines 11, 11' and the data lines 12, 12' may be formed by using the photolithographic method and the etching method on the transparent substrate, wherein the transparent substrate may a glass substrate or the like. The liquid crystal panel of the present disclosure includes a plurality of pixel structures 1 arranged in matrix.

In the present embodiment, the common line 13 is substantially parallel to the scan line 11, located at an opposite side of a pixel area with respect to the scan line 11 (e.g. adjacent to the scan line 11' of an adjacent pixel area in FIG. 2) and electrically coupled to the first electrode 14, wherein the first electrode 14 and the common line 13 are also formed by using the photolithographic method and the etching method on the transparent substrate, and the first electrode 14 is formed within the whole pixel area of the pixel structure 1 (or a little smaller than the pixel area). In the present embodiment, the first electrode 14 is served as a common electrode and the material thereof may be, but not limited to, indium-tin oxide (ITO), indium-zinc-oxide (IZO) or the like. In another embodiment, the common line 13 may be at the center or other locations of the pixel structure 1 as long as the common line 13 is electrically coupled to the first electrode 14, and the location thereof may be determined according to different applications.

The second electrode 15 is formed by using the photolithographic method and the etching method upon the first electrode 14 and the material thereof may be the transparent material such as ITO, IZO or the like. At least an insulation layer and/or a protection layer are formed between the first electrode 14 and the second electrode 15 to electrically isolate the first electrode 14 from the second electrode 15. In this embodiment, the second electrode 15 is served as a pixel electrode. Although the second electrode 15 shown in FIG. 2 opens in one side, the present disclosure is not limited thereto, and the second electrode 15 may not open in both sides such that a plurality of slits are formed substantially at the center, wherein a layout of the second electrode 15 may be similar to that of conventional FFS mode liquid crystal displays without any particular limitation.

The switching transistor 16 is formed adjacent to a crossing point of the scan line 11 and the data line 12 and electrically coupled to the second electrode 15 via a contact hole. The switching transistor 16 is configured to input a display voltage of the data line 12 to the second electrode 14 according to the control of the gate line 11, wherein the first electrode 14 and the second electrode 15 are arranged in such a way that the display voltage forms a transverse electric field between the first electrode 14 and the second electrode 15 thereby forming a horizontal electric field type liquid crystal display. The switching transistor 16 may be a thin-film transistor (TFT) and the structure and operation thereof is well known to the art and thus details thereof will not be repeated herein.

Figure 3:
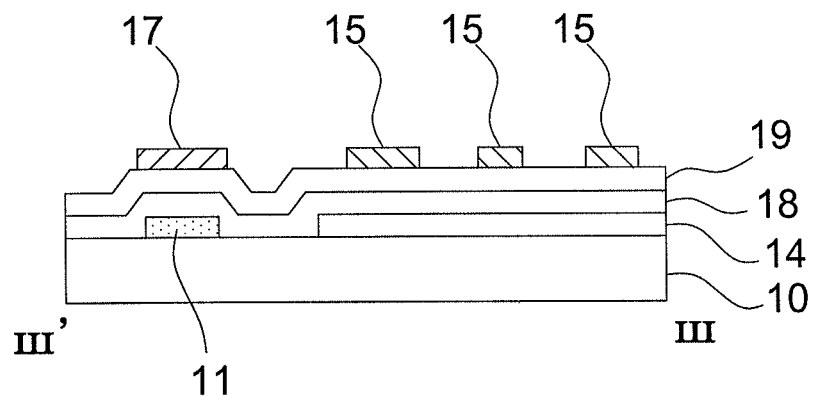
FIG. 3 shows a schematic equivalent circuit diagram of the liquid crystal panel according to the embodiment of the present disclosure.

In the present disclosure, in order to eliminate the stray capacitance induced by the operation of the gate line 11, a shield layer 17 is formed upon and overlapping the gate line 11 to block the stray electric field by means of the shielding effect of metal, wherein the shield layer 17 overlaps at least a part of the gate line 11 without overlapping with the switching transistor 16 preferably so as not to influence the operation thereof, and the shield layer 17 is electrically isolated from the first electrode 14 and the second electrode 15. In the present disclosure, the liquid crystal panel, e.g. a control chip thereof, may individually provide a shield voltage to the shield layer 17. In this manner, it is able to select a proper shield voltage according to the stray electric field actually formed during operation of the liquid crystal panel; meanwhile, operation voltages of the first electrode 14 and the second electrode 15 will not fluctuate due to the coupling effect whereby the display quality of the liquid crystal panel will not be degraded. For example as shown in FIG. 3, the first electrode 14 (and the common line 13) is coupled to a first voltage $V_1$ and the shield layer 17 is coupled to a second voltage $V_2$, wherein the first voltage $V_1$ and the second voltage $V_2$ are individually provided by the liquid crystal panel so as to prevent the coupling effect from causing the voltage fluctuation of the first electrode 14 or the second electrode 15. In addition, in order to allow the shield layer 17 to be able to effectively block the stray electric field of the gate line 11, a width of the shield layer 17 is preferably a little larger than that of the gate line 11.

Figure 4:
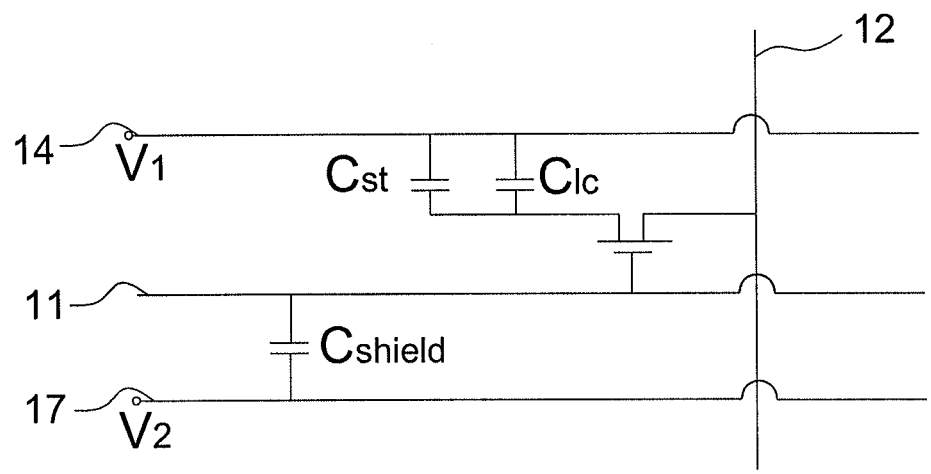
FIG. 4 shows a cross-sectional view of the pixel structure taken along line III-III' of FIG. 2.

Please refer to FIG. 4, it shows a cross-sectional view of the pixel structure taken along line III-III' of FIG. 2. The pixel structure of the present disclosure is formed according to the following procedures. First, a first metal layer is formed on the transparent substrate 10, and the first metal layer includes the gate line 11 and the common line 13 which may be formed by using the photolithographic method and the etching method. Next, the first electrode 14 is formed by using the photolithographic method and the etching method in the pixel area and electrically coupled to the common line 13. Then, an insulation layer 18 and a passivation layer 19 are sequentially formed on the first metal layer and the first electrode layer 14, wherein the insulation layer 18 may be a silicon nitride layer or a silicon oxide layer and the passivation layer 19 may be a silicon nitride layer, but not limited thereto. Next, a second metal layer is formed by using the photolithographic method and the etching method on the passivation layer 19, and the second metal layer includes the second electrode 15 and the shield layer 17, wherein a width of the shield layer 17 is preferably equal to or a little larger than that of the gate line 11. The shield layer 17 and the second electrode 15 may have identical or different materials. In addition, the number of the passivation layer 19 and/or the insulation layer 18 sandwiched between the second metal layer and the first metal layer may be determined according to actual applications. Furthermore, although the first metal layer is formed before the first electrode 14 as mentioned above, it is only exemplary and the first electrode 14 may be formed before the first metal layer.

In the present disclosure, materials of the scan lines 11 and 11', date lines 12 and 12', common line 13, first electrode 14, second electrode 15 and switching transistor 16 may be the suitable material used in conventional liquid crystal panels and are not limited to those disclosed in the present disclosure.

Accordingly, the liquid crystal panel of the present disclosure includes a transparent substrate 10, and a plurality of gate lines 11 (11'), a plurality of common lines 13, a plurality of date lines 12 (12'), a plurality of first electrodes 14, a plurality of second electrodes 15, a plurality of switching transistors 16 and a plurality of shield layers 17 formed on the transparent substrate 10, wherein the gate lines 11 (11') and the common lines 13 are formed on the transparent substrate 10 in parallel; the date lines 12 (12') are formed on the transparent substrate 10 in parallel and perpendicular to the gate lines 11 (11') and the common lines 13; the first electrodes 14 are respectively formed in a pixel area defined by two gate lines (e.g. 11 and 11') and two data lines (e.g. 12 and 12') and electrically coupled to the common lines 13; the second electrodes 15 are respectively formed in the pixel areas; the switching transistors 16 are respectively located adjacent to crossing points of the gate lines 11 (11') and the date lines 12 (12') and configured to input display voltages of the date lines 12 (12') to the second electrodes 15 according to the control of the gate lines 11 (11'); each of the first electrodes 14 and the associated second electrode 15 are arranged in such a way that the associated display voltage forms a transverse electric field between the first electrode 14 and the second electrode 15; and the shield layers 17 respectively overlap at least a part of the gate lines 11 (11') and are electrically isolated from the first electrodes 14 and the second electrodes 15.

In addition, although the liquid crystal panel and the pixel structure thereof of the present disclosure are illustrated by means of FFS mode liquid crystal panel, they are only exemplary and the present disclosure may also be adapted to the IPS mode liquid crystal panel and can achieve the same effect, wherein in the IPS mode liquid crystal panel the shield layer 17 also overlaps at least a part of the gate line and is electrically isolated from other electrodes, and an individual shield voltage is provided by the liquid crystal panel to the shield layer so as to eliminate the influence of the coupling effect, and the shield voltage may be adjusted according to the stray electric field.

As mentioned above, in the conventional horizontal electric field type liquid crystal display liquid crystal molecules close to the gate lines will be influenced by the stray electric field and thus are not able to rotate to the desired positions thereby causing light leakage in dark state to decrease the contrast of the display panel. The present disclosure further provides a pixel structure of the horizontal electric field type liquid crystal display (FIG. 2) in which a shield layer is further formed upon a gate line so as to block the stray electric field generated by the stray capacitance associated with the gate line. The light leakage in dark state can be significantly decreased thereby improving the contrast of the display panel.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A pixel structure of a liquid crystal panel, comprising:
a transparent layer; and
a gate line, a data line, a switching transistor, a first electrode, a second electrode and a shield layer formed on the transparent layer; wherein
the gate line is perpendicular to the data line;
the switching transistor is located adjacent to a crossing point of the gate line and the data line, and configured to input a display voltage of the data line to the second electrode according to the control of the gate line;
the first electrode and the second electrode are arranged in such a way that the display voltage forms a transverse electric field between the first electrode and the second electrode;
the shield layer overlaps at least a part of the gate line and is electrically isolated from the first electrode and the second electrode,
wherein the first electrode is coupled to a first voltage and the shield layer is coupled to a second voltage, and the second voltage is only provided to the shield layer.

2. The pixel structure as claimed in claim 1, further comprising a common line electrically coupled to the first electrode.

3. The pixel structure as claimed in claim 1, wherein a width of the shield layer is larger than that of the gate line, and the shield layer does not overlap with the switching transistor.

4. The pixel structure as claimed in claim 1, wherein a material of the shield layer is identical to that of the second electrode.

5. A liquid crystal panel, comprising:
a transparent substrate;
a plurality of gate lines and a plurality of common lines formed on the transparent substrate in parallel;
a plurality of data lines formed on the transparent substrate in parallel and perpendicular to the gate lines and the common lines;
a plurality of first electrodes respectively formed in a pixel area defined by two of the gate lines and two of the data lines and electrically coupled to the common lines;
a plurality of second electrodes respectively formed in the pixel areas;
a plurality of switching transistors respectively located adjacent to crossing points of the gate lines and the data lines and configured to input display voltages of the data lines to the second electrodes according to the control of the gate lines, wherein each of the first electrodes and the associated second electrode are arranged in such a way that the associated display voltage forms a transverse electric field between the first electrode and the second electrode; and a plurality of shield layers respectively overlapping at least a part of the gate lines, and electrically isolated from the first and second electrodes, wherein the common lines are coupled to a first voltage and the shield layers are coupled to a second voltage, and the second voltage is only provided to the shield layers.

6. The liquid crystal panel as claimed in claim 5, wherein a width of the shield layers is larger than that of the gate lines, and the shield layers do not overlap with the switching transistors.

7. The liquid crystal panel as claimed in claim 5, wherein a material of the shield layers is identical to that of the second electrodes.

8. The liquid crystal panel as claimed in claim 5, which is an in-plane switching mode liquid crystal panel or a fringe field switching mode liquid crystal panel.

\* \* \* \* \*